(12) United States Patent
Jeong et al.

(10) Patent No.: US 11,656,131 B2
(45) Date of Patent: May 23, 2023

(54) DIGITAL TEMPERATURE SENSING CIRCUIT

(71) Applicant: SK hynix Inc., Gyeonggi-do (KR)

(72) Inventors: Chan Hui Jeong, Gyeonggi-do (KR); Suk Hwan Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 61 days.

(21) Appl. No.: 17/353,099

(22) Filed: Jun. 21, 2021

(65) Prior Publication Data

US 2021/0310876 A1    Oct. 7, 2021

Related U.S. Application Data

(63) Continuation of application No. 16/030,071, filed on Jul. 9, 2018, now Pat. No. 11,099,080.

(30) Foreign Application Priority Data

Dec. 1, 2017    (KR) .......................... 10-2017-0164195

(51) Int. Cl.
*G01K 7/00* (2006.01)
*H03F 3/45* (2006.01)
*H03M 1/12* (2006.01)

(52) U.S. Cl.
CPC ........... *G01K 7/00* (2013.01); *H03F 3/45179* (2013.01); *H03F 3/45475* (2013.01); *H03M 1/12* (2013.01); *H03F 2200/129* (2013.01); *H03F 2203/45116* (2013.01)

(58) Field of Classification Search
CPC .............. G01K 7/01; G01K 7/00; G01K 7/16; G01K 7/24; G01K 15/005; G01K 1/028; G01K 2219/00; G01R 1/203; G05F 3/02; H03F 3/45179; H03F 3/45475; H03F 2200/129;

(Continued)

(56) References Cited

U.S. PATENT DOCUMENTS 6,681,135 B1 *   1/2004   Davis ................... A61N 1/3655
                                                       607/30
7,455,452 B2 *  11/2008   Seo ....................... G11C 11/406
                                                       374/171

(Continued)

FOREIGN PATENT DOCUMENTS

CN          1389917 A  *  1/2003  ............... G11C 7/04
CN        101162604 A  *  4/2008  ............... G01K 7/01

(Continued)

*Primary Examiner* — Gail Kaplan Verbitsky
(74) *Attorney, Agent, or Firm* — IP & T Group LLP

(57) ABSTRACT

The digital temperature sensing circuit includes a temperature voltage generator configured to generate a temperature voltage varying with a temperature in response to a first reference voltage, divide a supply voltage in response to a second reference voltage, and generate a high voltage and a low voltage, a code voltage generator configured to divide the second reference voltage based on the high voltage and the low voltage and output divided voltages having different voltage levels, and a mode selector supplied with the temperature voltage and the divided voltages, and configured to output a first code or a second code in response to a mode select signal, wherein the first code and the second code have different numbers of bits.

11 Claims, 10 Drawing Sheets

(58) Field of Classification Search
CPC ............... H03F 2203/45116; H03M 1/12; G11C 5/14; G11C 7/04
See application file for complete search history.

(56) References Cited

U.S. PATENT DOCUMENTS

| | | | | |
|---|---|---|---|---|
| 8,042,999 | B2* | 10/2011 | Jeong | G01K 7/01 374/170 |
| 8,322,922 | B2* | 12/2012 | Lee | G01K 7/015 374/170 |
| 2002/0180543 | A1* | 12/2002 | Song | G11C 7/04 331/176 |
| 2007/0176008 | A1* | 8/2007 | Chivers | H03M 1/06 236/46 R |
| 2010/0061160 | A1* | 3/2010 | Jeong | G11C 7/04 374/163 |
| 2011/0279168 | A1* | 11/2011 | Lee | G11C 7/04 327/512 |
| 2013/0144549 | A1* | 6/2013 | Temkine | G01K 15/005 702/99 |
| 2015/0338299 | A1* | 11/2015 | Eckert | G01L 7/08 73/730 |
| 2017/0257113 | A1* | 9/2017 | Singh | G01K 7/34 |

FOREIGN PATENT DOCUMENTS

| | | | | |
|---|---|---|---|---|
| JP | 2007327932 A | * | 12/2007 | ............ G11C 29/02 |
| JP | 2008097805 A | * | 4/2008 | ............... G01K 7/01 |
| KR | 101504340 B1 | * | 3/2015 | |
| KR | 101612359 B1 | * | 4/2016 | |
| KR | 20160051397 A | * | 5/2016 | |
| WO | WO-2005124785 A1 | * | 12/2005 | ........... G11C 11/406 |
| WO | WO-2010082565 A1 | * | 7/2010 | ............. H03M 3/474 |

* cited by examiner

DIGITAL TEMPERATURE SENSING CIRCUIT

CROSS-REFERENCE TO RELATED APPLICATION

This application is a continuation of U.S. patent application Ser. No. 16/030,071 filed on Jul. 9, 2018, which claims benefits of priority of Korean Patent Application No. 10-2017-0164195 filed on Dec. 1, 2017. The disclosure of each of the foregoing application is incorporated herein by reference in its entirety.

BACKGROUND

1. Field of Invention

Various embodiments of the present disclosure generally relate to a digital temperature sensing circuit, and more particularly, to a multi-mode digital temperature sensing circuit, which can selectively drive modes having different resolutions.

2. Description of Related Art

A memory system in which data is stored may include a digital temperature sensing circuit because some electrical characteristics of the memory system may be sensitive to temperature variations. The digital temperature sensing circuit may output detected temperature in the form of a digital code.

Since the digital temperature sensing circuit converts detected temperature into a digital code and then outputs a temperature code, the reliability of the memory system may be increased or decreased depending on the accuracy of the temperature code. Therefore, there is a need to improve the reliability of codes outputted from the digital temperature sensing circuit.

SUMMARY

Various embodiments of the present disclosure are directed to a digital temperature sensing circuit. The digital temperature sensing circuit may output temperature codes with a varying resolution depending on a selected mode of operation.

In accordance with an embodiment of the present disclosure, a digital temperature sensing circuit may include a temperature voltage generator configured to generate a temperature voltage varying with a temperature in response to a first reference voltage, divide a supply voltage in response to a second reference voltage, and generate a high voltage and a low voltage, a code voltage generator configured to divide the second reference voltage based on the high voltage and the low voltage and output divided voltages having different voltage levels, and a mode selector supplied with the temperature voltage and the divided voltages, and configured to output a first code or a second code in response to a mode select signal, wherein the first code and the second code have different numbers of bits.

In accordance with an embodiment of the present disclosure, a digital temperature sensing circuit may include a temperature voltage generator configured to generate a temperature voltage varying with a temperature, a high voltage, and a low voltage, a code voltage generator configured to output divided voltages having various voltage levels based on the high voltage and the low voltage, and a mode selector supplied with the temperature voltage and the divided voltages, and configured to output first codes or second codes having a resolution higher than that of the first codes in response to a mode select signal.

These and other features and advantages of the present invention will become apparent to those with ordinary skill in the art to which the present invention belongs from the following description in conjunction with the accompanying drawings.

DETAILED DESCRIPTION

Various exemplary embodiments of the invention will now be described in detail together with the accompanying drawings. It is noted, however, that the invention is not limited to the described embodiments but may also be embodied in other forms or variations thereof. Rather, these embodiments are provided so that the present disclosure will be thorough and complete, and will fully convey the technical spirit of the invention to those skilled in the art.

It is also noted that in this specification, "connected/coupled" refers to one component not only directly coupling another component but also indirectly coupling another component through an intermediate component. Also, in the specification, when an element is referred to as "comprising"

or "including" a component, it does not preclude another component but may further include other components unless the context clearly indicates otherwise.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Figure 1:
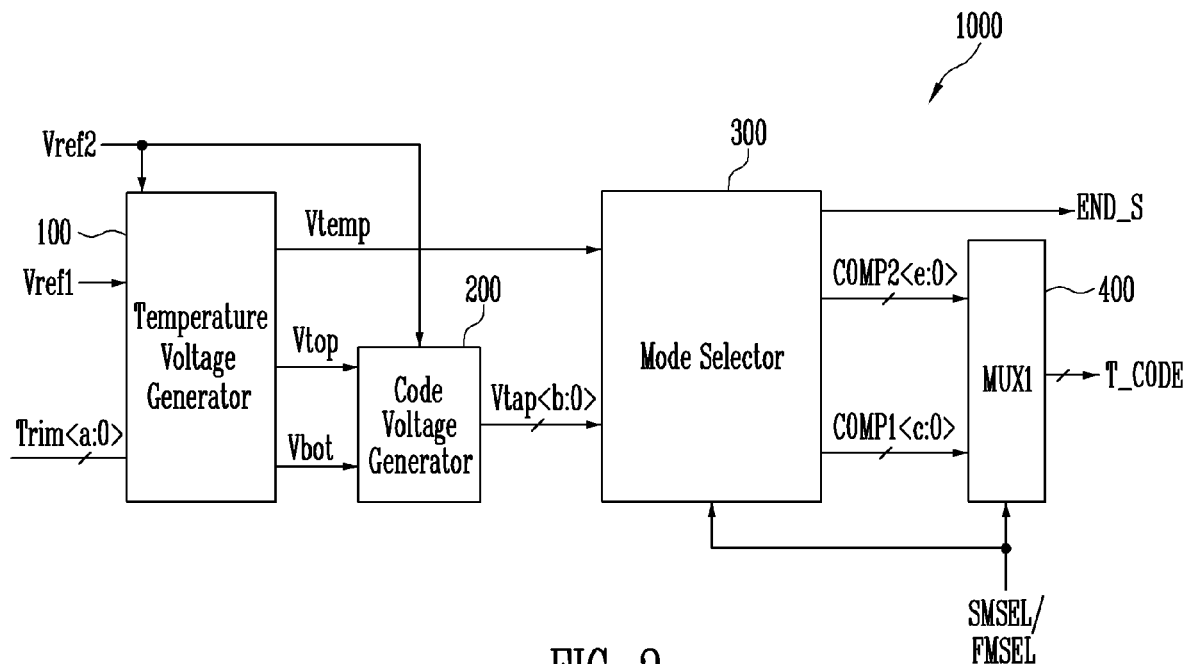
FIG. 1 is a simplified block diagram schematically illustrating a digital temperature sensing circuit in accordance with an embodiment of the present disclosure.

FIG. 1 is a simplified block diagram schematically illustrating a digital temperature sensing circuit according to an embodiment of the present disclosure.

Referring to FIG. 1, a digital temperature sensing circuit 1000 may output a temperature code T_CODE by converting detected temperature into a digital code. For this operation, the digital temperature sensing circuit 1000 may include a temperature voltage generator 100, a code voltage generator 200, a mode selector 300, and a first multiplexer 400.

The temperature voltage generator 100 may be operated in response to first and second reference voltages Vref1 and Vref2 and a trimming code Trim<a:0>, and may output a temperature voltage Vtemp varying with temperature, a high voltage Vtop, and a low voltage Vbot. The first and second reference voltages Vref1 and Vref2 may be generated from different internal voltage sources.

The code voltage generator 200 may be operated in response to the second reference voltage Vref2, and may output divided voltages Vtap<b:0> having various levels depending on the high voltage Vtop and the low voltage Vbot.

The mode selector 300 may be supplied with the temperature voltage Vtemp and the divided voltages Vtap<b:0>, and may output either of a first code COMP1<c:0> and a second code COMP2<e:0> which have different numbers of bits in response to a first or a second mode select signal SMSEL or FMSEL. For example, the mode selector 300 may output the first code COMP1<c:0> in a first mode in response to the first mode select signal FMSEL, and may output the second code COMP2<e:0> in a second mode in response to the second mode select signal SMSEL. For example, the first mode may be a fast mode, and the second mode may be a slow mode.

The slow mode may require a high-resolution code. Hence, in the slow mode the digital temperature sensing circuit 1000 may output a code having a higher resolution than that in the fast mode. For example, the number of bits of the first code COMP1<c:0> may be less than that of the second code COMP2<e:0> so that the temperature code T_CODE varying with temperature may be outputted fast in the fast mode. For example, the first code COMP1<c:0> may have 4 bits, and the second code COMP2<e:0> may have 9 bits. That is, since the resolution of the second code COMP2<e:0> is higher than that of the first code COMP1<c:0>, the time required for outputting the second code COMP2<e:0> is longer than the time required for outputting the first code COMP1<c:0>.

A fast mode select signal FMSEL may be enabled in the fast mode, and a slow mode select signal SMSEL may be enabled in the slow mode. When the number of modes is two, e.g. a fast mode and a slow mode, the fast and the slow mode select signals FMSEL and SMSEL may be outputted as a 1-bit signal having '0' or '1.' For example, when the fast mode select signal FMSEL is '1', the slow mode select signal may be '0', whereas when the fast mode select signal FMSEL is '0', the slow mode select signal may be '1.' When the digital temperature sensing circuit 1000 is used in a memory system, the fast mode select signal FMSEL and the slow mode select signal SMSEL may be outputted from a memory controller, and may be transferred to the digital temperature sensing circuit 1000.

Further, in the slow mode, the mode selector 300 may output an end signal END_S whenever the second code COMP2<e:0> having a preset number of bits is outputted.

The first multiplexer 400 may output the first code COMP1<c:0> or the second code COMP2<e:0> as the temperature code T_CODE in response to the fast mode select signal FMSEL or the slow mode select signal SMSEL.

Figure 2:
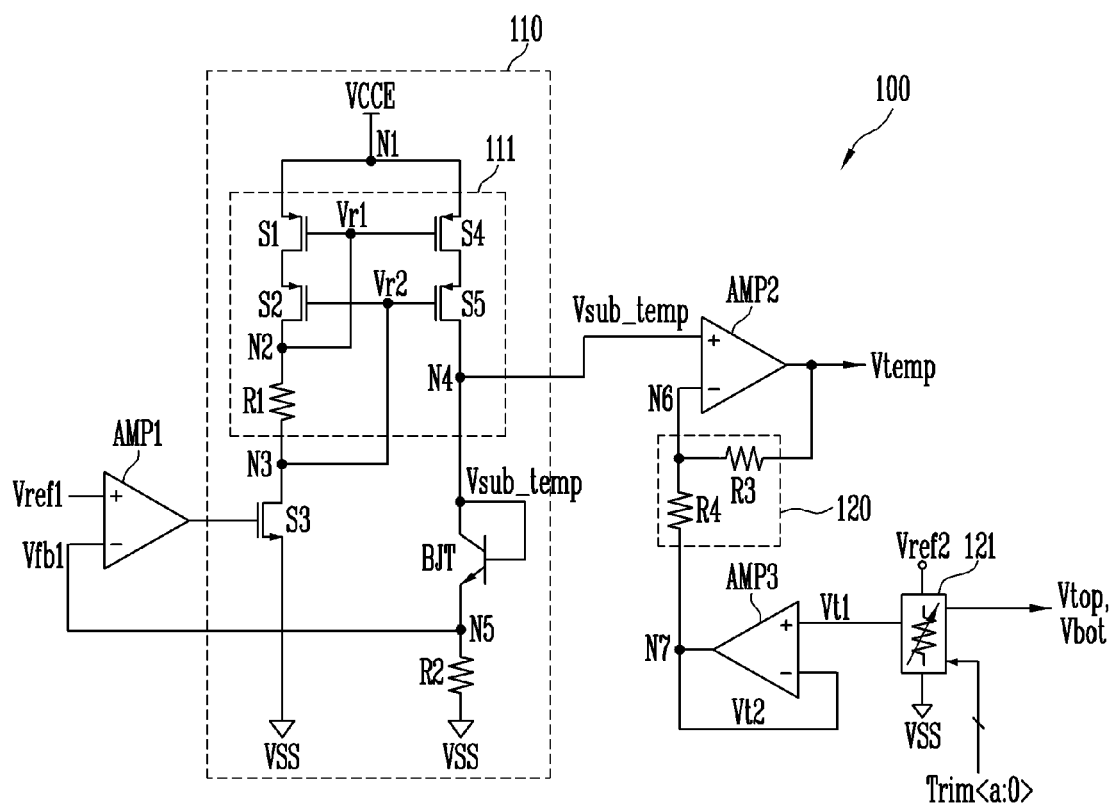
FIG. 2 is a circuit diagram illustrating a temperature voltage generator of FIG. 1.

FIG. 2 is a circuit diagram illustrating an exemplary configuration of the temperature voltage generator 100 of FIG. 1.

Referring to FIG. 2, the temperature voltage generator 100 may include a first amplifier AMP1, a temperature compensation circuit 110, a second amplifier AMP2, a division circuit 120, a third amplifier AMP3, and a trimming circuit 121.

The first amplifier AMP1 may compare a first reference voltage Vref1 with a first feedback voltage Vfb1, and may then output a comparison result voltage. For example, the first reference voltage Vref1 may be applied to a positive terminal (+) of the first amplifier AMP1, and the first feedback voltage Vfb1 may be applied to a negative terminal (−) of the first amplifier AMP1. For example, when the first reference voltage Vref1 is higher than the first feedback voltage Vfb1, the first amplifier AMP1 may output a high-level voltage. When the first reference voltage Vref1 is lower than the first feedback voltage Vfb1, the first amplifier AMP1 may output a low-level voltage.

The temperature compensation circuit 110 may output a sub-voltage Vsub_temp inversely proportional to temperature in response to the voltage outputted from the first amplifier AMP1. Also, the temperature compensation circuit 110 may output the first feedback voltage Vfb1 and feed it back to the first amplifier AMP1. The temperature compensation circuit 110 will be described in detail below.

The temperature compensation circuit 110 may include a mirror circuit 111. The mirror circuit 111 may mirror current, generated at a third node N3, to the fourth node N4. For example, the mirror circuit 111 may include first and second switches S1 and S2 which are coupled in series between a first node N1 and a second node N2, a first resistor R1 which is coupled between the second node N2 and the third node N3, and fourth and fifth switches S4 and S5 which are coupled in series between the first node N1 and the fourth node N4. The first, second, fourth, and fifth switches S1, S2, S4 and S5 may be implemented as PMOS transistors. Gates of the first and fourth switches S1 and S4 may be coupled in common to the second node N2, and gates of the second and fifth switches S2 and S5 may be coupled in common to the third node N3. Therefore, the mirror circuit 111 may mirror current flowing through the second node N2 and the third node N3 to the fourth node N4.

Further, the temperature compensation circuit 110 may include a third switch S3 which is coupled between the third node N3 and a ground terminal VSS, a bipolar junction transistor (BJT) which is coupled between the fourth node N4 and a fifth node N5, and a second resistor R2 which is coupled between the fifth node N5 and the ground terminal VSS.

The third switch S3 may be implemented as an NMOS transistor, and may generate a current between the third node N3 and the ground terminal VSS in response to the voltage outputted from the first amplifier AMP1. For example, when the voltage outputted from the first amplifier AMP1 is higher than the threshold voltage of the third switch S3, the third switch S3 is turned on, and thus a current path may be formed between the third node N3 and the ground terminal VSS. For example, the potential of the third node N3 may be adjusted depending on the turn-on level of the third switch S3. Therefore, when the third switch S3 is turned on, current is generated at the third node N3, and thus the mirror circuit 111 coupled to the third node N3 may be operated.

The BJT may be implemented as an NPN-type transistor. For example, a base and a collector of the BIT may be coupled in common to the fourth node N4, and an emitter of the BIT may be coupled to the fifth node N5. When the potential of the fourth node N4 transitions to a high logic level, a voltage inversely proportional to the temperature is formed across both ends of the BIT, that is, the collector and the emitter, and thus a sub-voltage Vsub_temp inversely proportional to the temperature may be outputted through the fourth node N4.

The second amplifier AMP2 may compare the sub-voltage Vsub_temp with the voltage of a sixth node N6, and then output a temperature voltage Vtemp. For example, the sub-voltage Vsub_temp may be applied to the positive terminal (+) of the second amplifier AMP2, and the sixth node N6 may be coupled to the negative terminal (−) of the second amplifier AMP2. The voltage of the sixth node N6 may vary in response to both the temperature voltage Vtemp outputted from the second amplifier AMP2 and a voltage outputted from the third amplifier AMP3. For example, the voltage of the sixth node N6 may be determined by the division circuit 120. The division circuit 120 may include a third resistor R3 coupled between the output node of the second amplifier AMP2 and the sixth node N6 and a fourth resistor R4 coupled between a seventh node N7, which is the output node of the third amplifier AMP3, and the sixth node N6.

The third amplifier AMP3 may control the voltage of the seventh node N7 in response to a first trimmed down voltage Vt1, outputted from the trimming circuit 121, and a second trimmed down voltage Vt2, outputted from the third amplifier AMP3. For example, the first trimmed down voltage Vt1 may be applied to the positive terminal (+) of the third amplifier AMP3, and the second trimmed down voltage Vt2 may be applied to the negative terminal (−) of the third amplifier AMP3. That is, the second trimmed down voltage Vt2 is fed back from the output of the third amplifier AMP3.

The trimming circuit 121 may be operated in response to the second reference voltage Vref2, and may output the first trimmed down voltage Vt1 which may vary depending on a preset trimming code Trim<a:0>, a high voltage Vtop, and a low voltage Vbot. For example, the first trimmed down voltage Vt1 may be a voltage different from the high voltage Vtop and the low voltage Vbot, or may be the high voltage Vtop or the low voltage Vbot. The trimming circuit 121 will be described in detail below.

Figure 3:
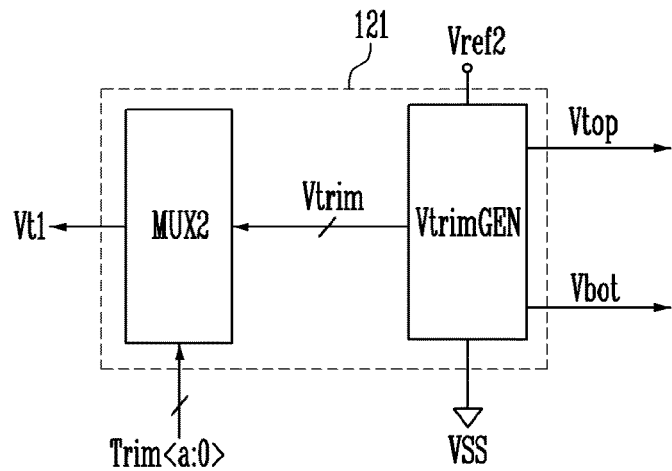
FIG. 3 is a simplified block diagram schematically illustrating a trimming circuit of FIG. 2.

FIG. 3 is a simplified block diagram schematically illustrating an exemplary configuration of the trimming circuit 121 of FIG. 2.

Referring to FIG. 3, the trimming circuit 121 may include a trim voltage generator VtrimGEN and a second multiplexer MUX2. The trim voltage generator VtrimGEN may output a plurality of trimmed down divided voltages Vtrim, a high voltage Vtop, and a low voltage Vbot in response to the second reference voltage Vref2. For example, the high voltage Vtop and the low voltage Vbot may be voltages included in the trimmed down divided voltages Vtrim. The trim voltage generator VtrimGEN will be described in detail later with reference to FIG. 4.

The second multiplexer MUX2 may output a voltage, selected from among the trimmed down divided voltages Vtrim, as a first trimmed down voltage Vt1 in response to a trimming code Trim<a:0>.

Figure 4:
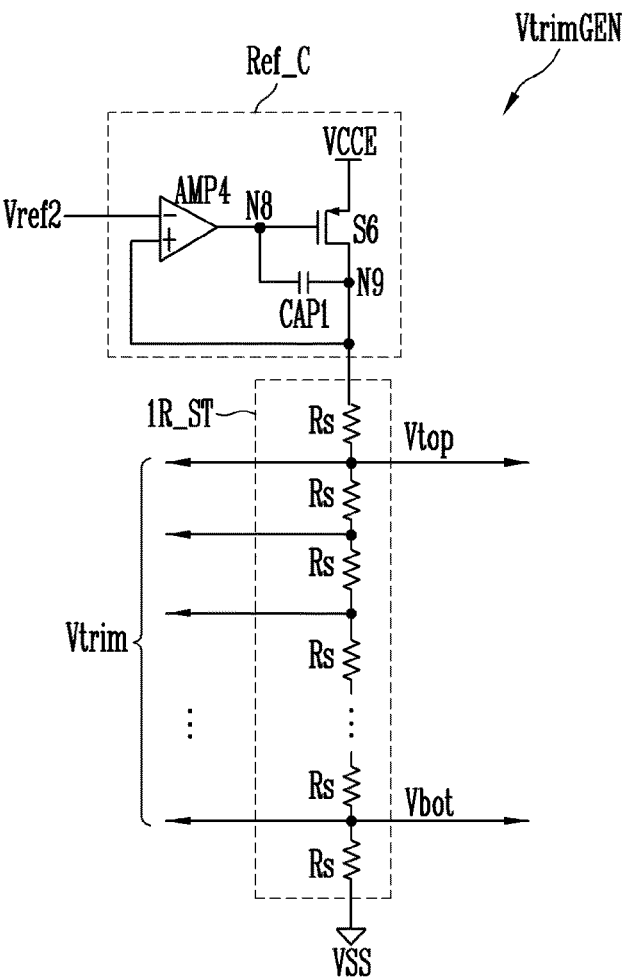
FIG. 4 is a circuit diagram illustrating a trim voltage generator of FIG. 3.

FIG. 4 is a circuit diagram illustrating an exemplary configuration of the trim voltage generator VtrimGEN of FIG. 3.

Referring to FIG. 4, a trim voltage generator VtrimGEN may be operated in response to a second reference voltage Vref2 and a trimming code Trim<a:0>, and may output a temperature voltage Vtemp varying with temperature, a high voltage Vtop, and a low voltage Vbot.

For this operation, the trim voltage generator VtrimGEN may include a reference voltage transfer circuit Ref_C and a first resistor string 1R_ST.

The reference voltage transfer circuit Ref_C may uniformly transfer a supply voltage VCCE to a ninth node N9 in response to the second reference voltage Vref2. For example, the reference voltage transfer circuit Ref_C may include a fourth amplifier AMP4, a sixth switch S6, and a first capacitor CAP1. The fourth amplifier AMP4 may compare the second reference voltage Vref2 with the voltage of the ninth node N9, and may output a comparison result voltage through an eighth node N8. For example, the second reference voltage Vref2 may be applied to the negative terminal (−) of the fourth amplifier AMP4, and the ninth node N9 may be coupled to the positive terminal (+) of the fourth amplifier AMP4. The sixth switch S6 may be implemented as a PMOS transistor for connecting or disconnecting the terminal of the supply voltage VCCE and the ninth node N9 in response to the potential of the eighth node N8.

The first capacitor CAP1 may be coupled between the eighth node N8 and the ninth node N9.

Because of the configuration of the above-described reference voltage transfer circuit Ref_C, the reference voltage transfer circuit Ref_C may be operated as follows.

When the second reference voltage Vref2 is higher than the voltage of the ninth node N9, the fourth amplifier AMP4 may output a negative voltage, so that the sixth switch S6 is turned on, and thus an amplified voltage may be applied to the ninth node N9. When the second reference voltage Vref2 is lower than the voltage of the ninth node N9, the fourth amplifier AMP4 may output a positive voltage, and thus the sixth switch S6 may be turned off. Since the sixth switch S6 is turned on or off depending on the voltage of the eighth node N8 in this way, the voltage of the ninth node N9 may be varied, and a voltage gain may be decreased by the first capacitor CAP1, and thus variation of the voltage of the ninth node N9 may be decreased.

The first resistor string 1R_ST may include a plurality of string resistors Rs coupled in series between the ninth node N9 and the ground terminal VSS. The string resistors Rs included in the first resistor string 1R_ST may have the same resistance value. When a voltage is applied to the ninth node N9, a current path through which current flows from the ninth node N9 to the ground terminal VSS may be formed, and thus trimmed down divided voltages Vtrim having different voltage levels may be outputted depending on the locations of the nodes coupled between the string resistors Rs. For example, as the location of each node is closer to the reference voltage transfer circuit Ref_C, the level of a trimmed down divided voltage Vtrim may be increased. For example, the voltage of a node closest to the ninth node N9 may be set to a high voltage Vtop, and the voltage of a node farthest from the ninth node N9 may be set to a low voltage Vbot. Nodes set to the nodes from which the high voltage Vtop and the low voltage Vbot are outputted may differ according to the digital temperature sensing circuit 1000.

Figure 5:
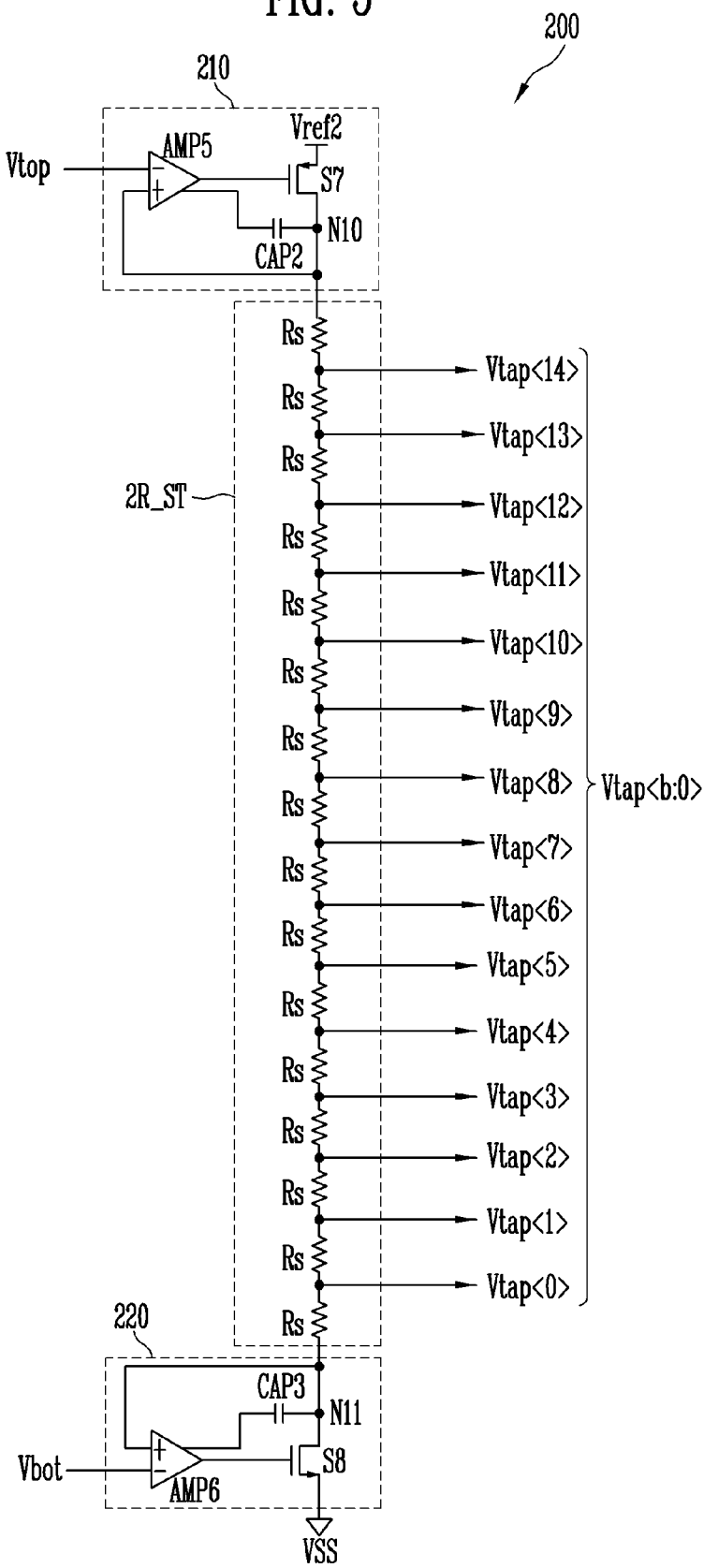
FIG. 5 is a circuit diagram illustrating a code voltage generator of FIG. 1.

FIG. 5 is a circuit diagram illustrating an exemplary configuration of the code voltage generator 200 of FIG. 1.

Referring to FIG. 5, the code voltage generator 200 may be operated in response to a second reference voltage Vref2, and may output divided voltages Vtap<b:0> having various levels depending on a high voltage Vtop and a low voltage Vbot.

For this, the code voltage generator 200 may include a high-voltage transfer circuit 210, a second resistor string 2R_ST, and a low-voltage transfer circuit 220.

The high-voltage transfer circuit 210 may include a fifth amplifier AMP5, a seventh switch S7, and a second capacitor CAP2. The fifth amplifier AMP5 may vary the voltage of a tenth node N10 in response to the high voltage Vtop. The seventh switch S7 may be implemented as a PMOS transistor which can connect or disconnect a terminal to which the second reference voltage Vref2 is applied and the tenth node N10 in response to the output voltage of the fifth amplifier AMP5. The second capacitor CAP2 may be coupled between an additional output terminal of the fifth amplifier AMP5 and the tenth node N10. For example, of the output voltages of the fifth amplifier AMP5, a voltage applied to the second capacitor CAP2 may be lower than the voltage applied to the seventh switch S7. Of the output nodes of the fifth amplifier AMP5, an output node coupled to the second capacitor CAP2 may be maintained at a stable voltage level by the second capacitor CAP2, thereby enabling the voltage of the output node coupled to the seventh switch S7 to be stably maintained.

The second resistor string 2R_ST may include a plurality of string resistors Rs coupled in series between the high-voltage transfer circuit 210 and the low-voltage transfer circuit 220. For example, the second resistor string 2R_ST may include 16 string resistors Rs. In this case, the second resistor string 2R_ST may divide the voltage between the high-voltage transfer circuit 210 and the low-voltage transfer circuit 220 and may output first to 15-th divided voltages Vtap<14:0> having different levels.

The string resistors Rs included in the second string 2R_ST have the same resistance value, and may have a resistance value identical to or different from that of the string resistors included in the first resistor string 1R_ST of FIG. 4. The second resistor string 2R_ST may be coupled between the tenth node N10 of the high-voltage transfer circuit 210 and an 11-th node N11 of the low-voltage transfer circuit 220. When the voltage is applied to the tenth node N10, a current path through which current flows from the tenth node N10 to the 11-th node N11 may be formed, and thus divided voltages (tap voltages) Vtap<b:0> having different voltage levels may be outputted depending on the locations of the nodes coupled between the string resistors Rs. For example, among the first to 15-th divided voltages Vtap<14:0>, the 15-th divided voltage Vtap<14> may have a highest level and the first divided voltage Vtap<0> may have a lowest level. For example, the voltage level may increase in a direction from the first divided voltage Vtap<0> to the fifth divided voltage Vtap<14>.

The low-voltage transfer circuit 220 may include a sixth amplifier AMP6, an eighth switch S8, and a third capacitor CAP3. The sixth amplifier AMP6 may be supplied with a lowest voltage, among the voltages divided by the second resistor string 2R_ST, and then operated to vary the voltage of the 11-th node N11 in response to the low voltage Vbot. For example, since the low-voltage transfer circuit 220 may be coupled between the second resistor string 2R_ST and the ground terminal VSS, it may maintain or decrease the voltage of the 11-th node N11 in response to the low voltage Vbot. The low voltage Vbot may be applied to the negative terminal (−) of the sixth amplifier AMP6, and the voltage of the 11-th node N11 may be applied to the positive terminal (+) of the sixth amplifier AMP6. The eighth switch S8 may be implemented as a PMOS transistor which may connect or disconnect the 11-th node N11 and the ground terminal VSS in response to the output voltage of the second amplifier AMP6. The third capacitor CAP3 may be coupled between an additional output terminal of the sixth amplifier AMP6 and the 11-th node N11. For example, of the output voltages of the sixth amplifier AMP6, a voltage applied to the third capacitor CAP3 may be lower than a voltage applied to the eighth switch S8. Of the output nodes of the sixth amplifier AMP6, an output node coupled to the third capacitor CAP3 may be maintained at a stable voltage level by the third capacitor CAP3, thus enabling the voltage of the output node coupled to the eighth switch S8 to be stably maintained.

The above-described fifth amplifier AMP5 and the sixth amplifier AMP6 may be configured in different structures, which will be described in detail below with reference to FIGS. 6 and 7.

Figure 6:
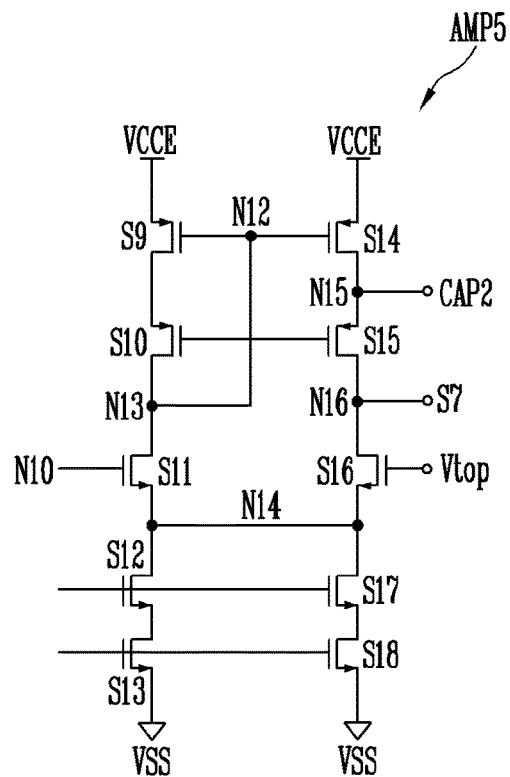
FIG. 6 is a circuit diagram illustrating a fifth amplifier of FIG. 5.

FIG. 6 is a circuit diagram illustrating an exemplary configuration of the fifth amplifier AMP5 of FIG. 5.

Referring to FIG. 6, the fifth amplifier AMP5 may include ninth to 18-th switches S9 to S18. The ninth to 13-th switches S9 to S13 and the 14-th to 18-th switches S14 to S18 may be coupled in parallel between a supply voltage terminal VCCE and a ground terminal VSS.

In detail, the ninth and tenth switches S9 and S10 may be coupled in series between the supply voltage terminal VCCE and a 13-th node N13, and the 14-th and 15-th switches S14 and S15 may be coupled in series between the supply voltage terminal VCCE and a 16-th node N16. All of the ninth, tenth, 14-th and 15-th switches S9, S10, S14 and S15 may be implemented as PMOS transistors. Gates of the ninth and 14-th switches S9 and S14 may be coupled in common to a 12-th node N12, and the 12-th node N12 may be coupled to the 13-th node N13. Therefore, the ninth and 14-th switches S9 and S14 may be turned on or off in response to the voltage applied to the 13-th node N13. Gates of the tenth and 15-th switches S10 and S15 may be coupled in common to each other. Since both the tenth and 15-th switches S10 and S15 are implemented as PMOS transistors, they may always remain turned on. A 15-th node connecting the 14-th and 15-th switches S14 and S15 to each other may be coupled to the second capacitor CAP2.

The 11-th switch S11 may be implemented as an NMOS transistor which may connect or disconnect the 13-th node N13 and a 14-th node N14 in response to the voltage of the tenth node N10 of FIG. 5. The 12-th and 13-th switches S12 and S13 may be implemented as NMOS transistors coupled in series between the 14-th node N14 and the ground terminal VSS.

The 16-th switch S16 may be implemented as an NMOS transistor which may connect or disconnect the 16-th node N16 and the 14-th node N14 in response to the high voltage Vtop. The 16-th node N16 between the 15-th and 16-th switches S15 and S16 may be coupled to the gate of the seventh switch S7 of FIG. 5. That is, the output terminals of the fifth amplifier AMP5 may be the 15-th and 16-th nodes N15 and N16, and the seventh switch S7 may be turned on or off by the voltage outputted through the 16-th node N16 of the output terminals. The voltage applied to the 16-th node N16 may have a level less than the voltage applied to the 15-th node N15 by the threshold voltage of the 15-th switch S15.

The 17-th and 18-th switches S17 and S18 may be implemented as NMOS transistors coupled in series between the 14-th node N14 and the ground terminal VSS.

Gates of the 12-th and 17-th switches S12 and S17 may be coupled to each other, and gates of the 13-th and 18-th switches S13 and S18 may be coupled to each other.

Figure 7:
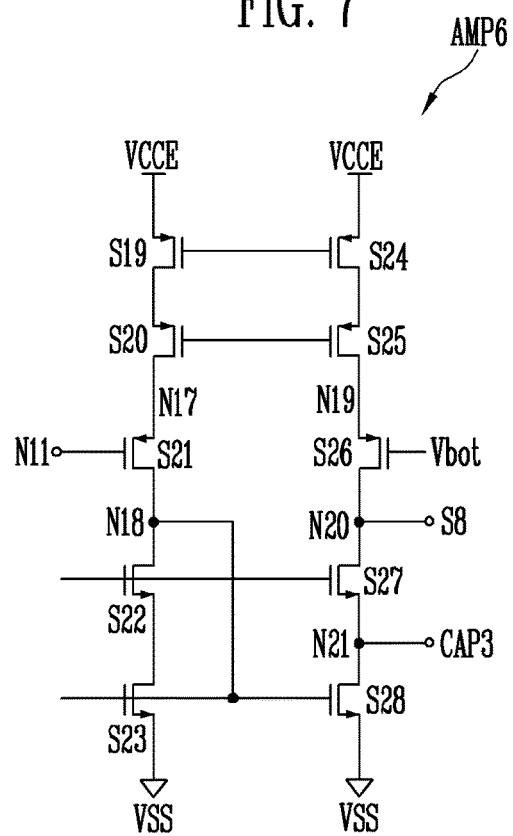
FIG. 7 is a circuit diagram illustrating a sixth amplifier of FIG. 5.

FIG. 7 is a circuit diagram illustrating an exemplary configuration of the sixth amplifier AMP6 of FIG. 5.

Referring to FIG. 7, the sixth amplifier AMP6 may include 19-th to 28-th switches S19 to S28. The 19-th to 23-rd switches S19 to S23 and the 24-th to 28-th switches S24 to S28 may be coupled in parallel between a supply voltage terminal VCCE and a ground terminal VSS.

In detail, the 19-th and 20-th switches S19 and S20 may be coupled in series between the supply voltage terminal VCCE and a 17-th node N17, and the 24-th and 25-th switches S24 and S25 may be coupled in series between the supply voltage terminal VCCE and a 19-th node N19. All of the 19-th, 20-th, 24-th and 25-th switches S19, S20, S24 and S25 may be implemented as PMOS transistors. Gates of the 19-th and 24-th switches S19 and S24 may be coupled to each other. Therefore, the 19-th and 24-th switches S19 and S24 may always remain turned on. Gates of the 20-th and 25-th switches S20 and S25 may be coupled in common to each other. Since both the 20-th and 25-th switches S20 and S25 are implemented as PMOS transistors, they may always remain turned on.

A gate of the 21-st switch S21 may be implemented as a PMOS transistor which is turned on or off in response to the potential of the 11-th node N11 of FIG. 5. The 22-nd and 23-rd switches S22 and S23 may be implemented as NMOS transistors coupled in series between an 18-th node N18 and the ground terminal VSS. A gate of the 23-rd switch S23 may be coupled to the 18-th node N18.

The 26-th switch S26 may be implemented as a PMOS transistor which may connect or disconnect the 19-th node N19 and a 20-th node N20 in response to the low voltage Vbot.

The 27-th and 28-th switches S27 and S28 may be implemented as NMOS transistors coupled in series between a 20-th node N20 and the ground terminal VSS. A gate of the 27-th switch S27 may be coupled to a gate of the 22-nd switch S22. A gate of the 28-th switch S28 may be coupled to the 18-th node N18. That is, the gates of the 23-rd and 28-th switches S23 and S28 may be coupled in common to the 18-th node N18.

Further, a 21-st node N21 between the 27-th and 28-th switches S27 and S28 may be coupled to the third capacitor CAP3 of FIG. 5. The voltage applied to the 21-st node N21 may have a level less than the voltage applied to the 20-th node N20 by the threshold voltage of the 21-st switch S21.

Figure 8:
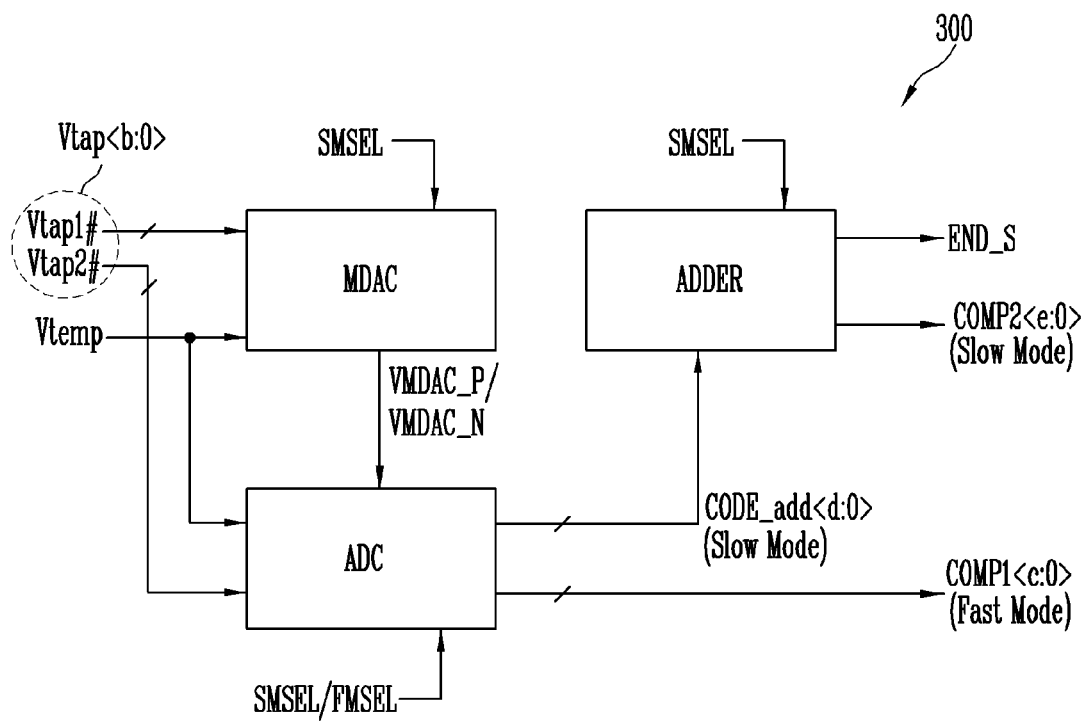
FIG. 8 is a simplified block diagram schematically illustrating a mode selector of FIG. 1.

FIG. 8 is a simplified block diagram schematically illustrating an exemplary configuration of the mode selector 300 of FIG. 1.

Referring to FIG. 8, the mode selector 300 may include a multi-digital-to-analog converter MDAC, an analog-to-digital converter ADC, and an adder ADDER.

The multi-digital-to-analog converter MDAC may output a positive voltage VMDAC_P and a negative voltage VMDAC_N in response to the slow mode select signal SMSEL, first sub-divided voltages Vtap1# being a part of divided voltages Vtap<b:0>, and a temperature voltage Vtemp. For example, the multi-digital-to-analog converter MDAC may be enabled only in a slow mode. For example, the multi-digital-to-analog converter MDAC may be operated only in the slow mode.

Among the divided voltages Vtap<b:0>, remaining second sub-divided voltages Vtap2# other than the first sub-divided voltages Vtap1# may be inputted to the ADC.

The ADC may output the first code COMP1<c:0> or an additional code CODE_add<d:0> in response to the mode select signal SMSEL or FMSEL, the second sub-divided voltages Vtap2#, the temperature voltage Vtemp, and the positive voltage VMDAC_P or the negative voltage VMDAC_N. The first code COMP1<c:0> may be outputted in response to the fast mode select signal FMSEL, and the additional code CODE_add<d:0> may be outputted in response to the slow mode select signal SMSEL.

The number of bits of the first code COMP1<c:0> may be greater than the number of bits of the additional code CODE_add<d:0>. For example, since the first code COMP1<c:0> is outputted in the fast mode, it may be outputted as a 4-bit code within a short period of time. However, the additional code CODE_add<d:0> may require a long time to convert temperature into a digital signal in order to realize high resolution, and may be outputted as a plurality of 2-bit codes. Therefore, in the slow mode, the additional code CODE_add<d:0> may be outputted in the form of a plurality of additional codes CODE_add<d:0> rather than being used as the temperature code. The outputted plurality of additional codes CODE_add<d:0> may be added by the adder ADDER during multiple cycles, and thereafter the added code may be outputted as the second code COMP2<e:0>.

The adder ADDER may be operated in response to the mode select signal SMSEL. For example, the adder ADDER may be enabled in response to the slow mode select signal SMSEL. For example, the adder ADDER may receive each additional code CODE_add<d:0> in response to the slow mode select signal SMSEL, may add received additional codes CODE_add<d:0> received while multiple cycles in which the additional codes CODE_add<d:0> are received are executed, and may output a resulting additional code CODE_add<d:0> as the second code COMP2<e:0>. For example, the adder ADDER may add one bit of the additional code CODE_add<d:0> received in a first cycle to one bit of the additional code CODE_add<d:0> received in a second cycle. In this way, the adder ADDER may generate the second code COMP2<e:0> composed of a plurality of bits by adding the plurality of 2-bit additional codes CODE_add<d:0> received in respective cycles. Further, the adder ADDER may output an end signal END_S whenever the second code COMP2<e:0> is outputted. That is, when a preset number of cycles are executed and the second code COMP2<e:0> having a preset number of bits is generated, the adder ADDER may output the second code COMP2<e:0>.

Figure 9:
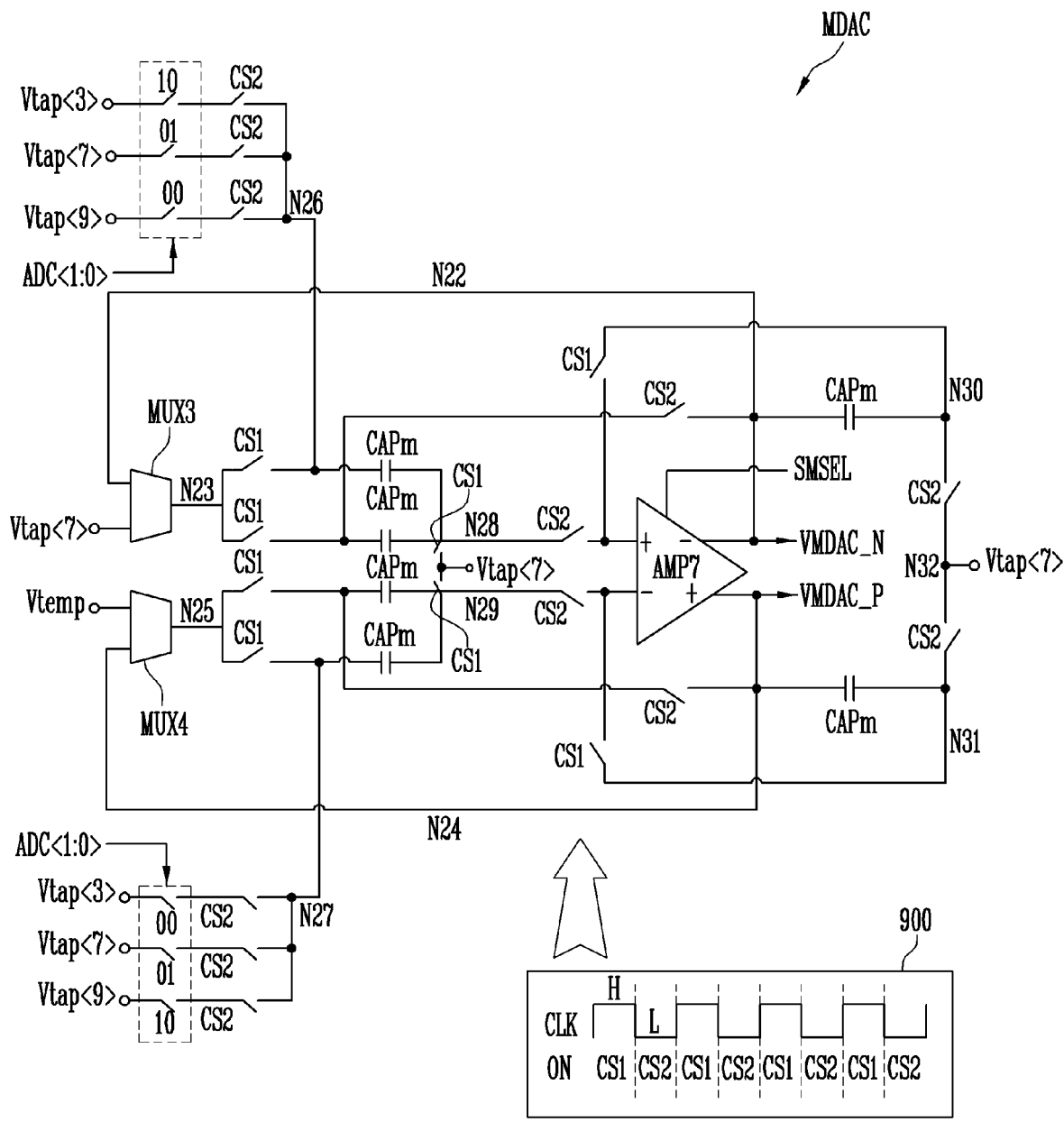
FIG. 9 is a circuit diagram illustrating a multi-digital-to-analog converter of FIG. 8.

FIG. 9 is a circuit diagram illustrating an exemplary configuration of the multi-digital-to-analog converter MDAC of FIG. 8.

Referring to FIG. 9, the multi-digital-to-analog converter MDAC may receive the temperature voltage Vtemp and the first sub-divided voltages Vtap1#, and may output the positive voltage VMDAC_P or the negative voltage VMDAC_N in response to the slow mode select signal SMSEL.

For this operation, the MDAC may include third and fourth multiplexers MUX3 and MUX4, a plurality of first and second clock switches CS1 and CS2 which are turned on or off in response to a clock CLK, a plurality of capacitors CAPm, and a seventh amplifier AMP7. The third multiplexer MUX3 may receive a reference divided voltage included in the first sub-divided voltages Vtap1# and the voltage of a 22-nd node, and may output a voltage selected from the received voltages to a 23-rd node N23. For example, the reference divided voltage may be a voltage corresponding to a median value, among the divided voltages Vtap<b:0> outputted from the code voltage generator 200. For example, it is assumed that the code voltage generator 200 outputs first to 15-th different voltages Vtap<14:0> and that the first divided voltage Vtap<0> has a lowest level and the divided voltages have gradually increased levels in a direction from the first divided voltage Vtap<0> to the 15-th divided voltage Vtap<14>. Among the first to 15-th divided voltages Vtap<14:0>, the eighth divided voltage Vtap<7> may correspond to a median value.

The fourth multiplexer MUX4 may receive the temperature voltage Vtemp and the voltage of a 24-th node N24, and output a voltage selected from the received voltages to a 25-th node N25.

Two first clock switches CS1 may be coupled in parallel to the 23-rd node N23, and two first clock switches CS1 may also be coupled in parallel to the 25-th node N25. The 25-th node N25 is not coupled to the 23-rd node N23.

The first clock switches CS1 may be turned on or off depending on an internal clock CLK that is generated in the digital temperature sensing circuit 1000 or an internal clock CLK generated in a memory system including the digital temperature sensing circuit 1000.

Referring to timing diagram 900 of FIG. 9, the first clock switches CS1 may be turned on when the internal clock CLK goes high (H). One first clock switch CS1 coupled to the 23-rd node N23 may be coupled between the 23-rd node N23 and a 26-th node N26, and another first clock switch CS1 may be coupled between the 23-rd node N23 and a corresponding capacitor CAPm. One first clock switch CS1 coupled to the 25-th node N25 may be coupled between the 25-th node N25 and a 27-th node N27, and another first clock switch CS1 may be coupled between the 25-th node N25 and a corresponding capacitor CAPm.

One capacitor CAPm may be coupled between the 26-th node N26 and a 28-th node N28, and an additional capacitor CAPm may also be coupled between the 27-th node N27 and a 29-th node N29. The capacitors CAPm coupled to the 23-rd node N23 may be coupled in common to the 28-th node N28, and the capacitors CAPm coupled to the 25-th node N25 may be coupled in common to the 29-th node N29. Two first clock switches CS1 may be coupled between the 28-th node N28 and the 29-th node N29. The eighth divided voltage Vtap<7> may be applied to a node between the first clock switches CS1 that are coupled between the 28-th node N28 and the 29-th node N29.

A plurality of second clock switches CS2 may be coupled in parallel to the 26-th node N26. The second clock switches CS2 may be turned on or off depending on the same internal clock CLK as the first clock switches CS1. However, the second clock switches CS2 may be operated in a way opposite to the first clock switches CS1.

Referring to the timing diagram 900 of FIG. 9, the second clock switches CS2 may be turned on when the internal clock CLK goes low (L). Alternatively, the first clock switches CS1 may be designated to be turned on at the low logic level L of the internal clock CLK, and the second clock switches CS2 may be designated to be turned on at the high logic level H of the internal clock CLK. In the embodiment of FIG. 9, the first clock switches CS1 are turned on at the high logic level H of the internal clock CLK, and the second clock switches CS2 are turned on at the low logic level L of the internal clock CLK.

Changeover switches that are turned on or turned off in response to analog-to-digital conversion codes ADC<1:0> may be coupled to respective second clock switches CS2 coupled to the 26-th node N26, and different divided voltages may be applied to the respective changeover switches. For example, one of the changeover switches may be coupled between a terminal to which a fourth divided voltage Vtap<3> is applied and one second clock switch CS2, another changeover switch may be coupled between a terminal to which an eighth divided voltage Vtap<7> is applied and another second clock switch CS2, and the other changeover switch may be coupled between a terminal to which a tenth divided voltage Vtap<9> is applied and the other second clock switch CS2. The changeover switch to which the fourth divided voltage Vtap<3> is applied may be turned on when the analog-to-digital conversion code is '10', the changeover switch to which the eighth divided voltage Vtap<7> is applied may be turned on when the analog-to-digital conversion code is '01', and the changeover switch to which the tenth divided voltage Vtap<9> is applied may be turned on when the analog-to-digital conversion code is '00.' For example, the analog-to-digital conversion codes ADC<1:0> may be additional codes CODE_add<d:0> outputted from the analog-to-digital converter ADC. For example, each additional code CODE_add<d:0> may be a code composed of 2 bits.

Second clock switches CS2 and changeover switches coupled to the 26-th node N26 may also be coupled in the same structure to the 27-th node N27. Among the changeover switches coupled to the 27-th node N27, for example, the changeover switch to which the fourth divided voltage Vtap<3> is applied may be turned on when the analog-to-digital conversion code is '00', the changeover switch to which the eighth divided voltage Vtap<7> is applied may be turned on when the analog-to-digital conversion code is '01', and the changeover switch to which the tenth divided voltage Vtap<9> is applied may be turned on when the analog-to-digital conversion code is '10'.

The seventh amplifier AMP7 may be enabled in response to the slow mode select signal SMSEL. The seventh amplifier AMP7 may output a positive voltage VMDAC_P and a negative voltage VMDAC_N through a positive output terminal (+) and a negative output terminal (−) depending on voltages applied to a positive input terminal (+) and a negative input terminal (−). For example, the voltage of the 28-th node N28 or a 30-th node N30 may be applied to the positive input terminal (+) of the seventh amplifier AMP7. When the second clock switches CS2 are turned on, the voltage of the 28-th node N28 may be applied to the positive input terminal (+) of the seventh amplifier AMP7, whereas when the first clock switches CS1 are turned on, the voltage of the 30-th node N30 may be applied to the positive input terminal (+) of the seventh amplifier AMP7. The voltage of the 29-th node N29 or a 31-st node N31 may be applied to the negative input terminal (−) of the seventh amplifier AMP7. When the second clock switches CS2 are turned on, the voltage of the 29-th node N29 may be applied to the negative input terminal (−) of the seventh amplifier AMP7, whereas when the first clock switches CS1 are turned on, the voltage of the 31-st node N31 may be applied to the negative input terminal (−) of the seventh amplifier AMP7. Therefore, one first clock switch CS1 may be coupled between the positive input terminal (+) of the seventh amplifier AMP7 and the 30-th node N30, and another first clock switch CS1 may be coupled between the negative input terminal (−) of the seventh amplifier AMP7 and the 31-st node N31.

A capacitor CAPm may be coupled between the 30-th node N30 and the 22-nd node N22, wherein the CAPm coupled to the 22-nd node N22 may be coupled to a node between one of the first clock switches CS1 coupled to the 23-rd node N23, i.e., a first clock switch CS1 which is not coupled to the 26-th node N26, and the capacitor CAPm.

A capacitor CAPm may be coupled between the 31-st node N31 and the 24-th node N24, wherein the CAPm coupled to the 24-th node N24 may be coupled to a node between one of the first clock switches CS1 coupled to the 25-th node N25, that is, a first clock switch CS1 which is not coupled to the 27-th node N27, and the capacitor CAPm.

One second clock switch CS2 may be coupled between the 30-th node N30 and a 32-nd node N32, and another clock switch CS2 may be coupled between the 31-st node N31 and the 32-nd node N32. The eighth divided voltage Vtap<7> may be applied to the 32-nd node N32.

The above-described multi-digital-to-analog converter MDAC may be enabled in response to the slow mode select signal SMSEL. As the first and second clock switches CS1 and CS2 are alternately turned on in response to the internal clock CLK, the MDAC may output a positive voltage VMDAC_P and a negative voltage VMDAC_N.

Figure 10:
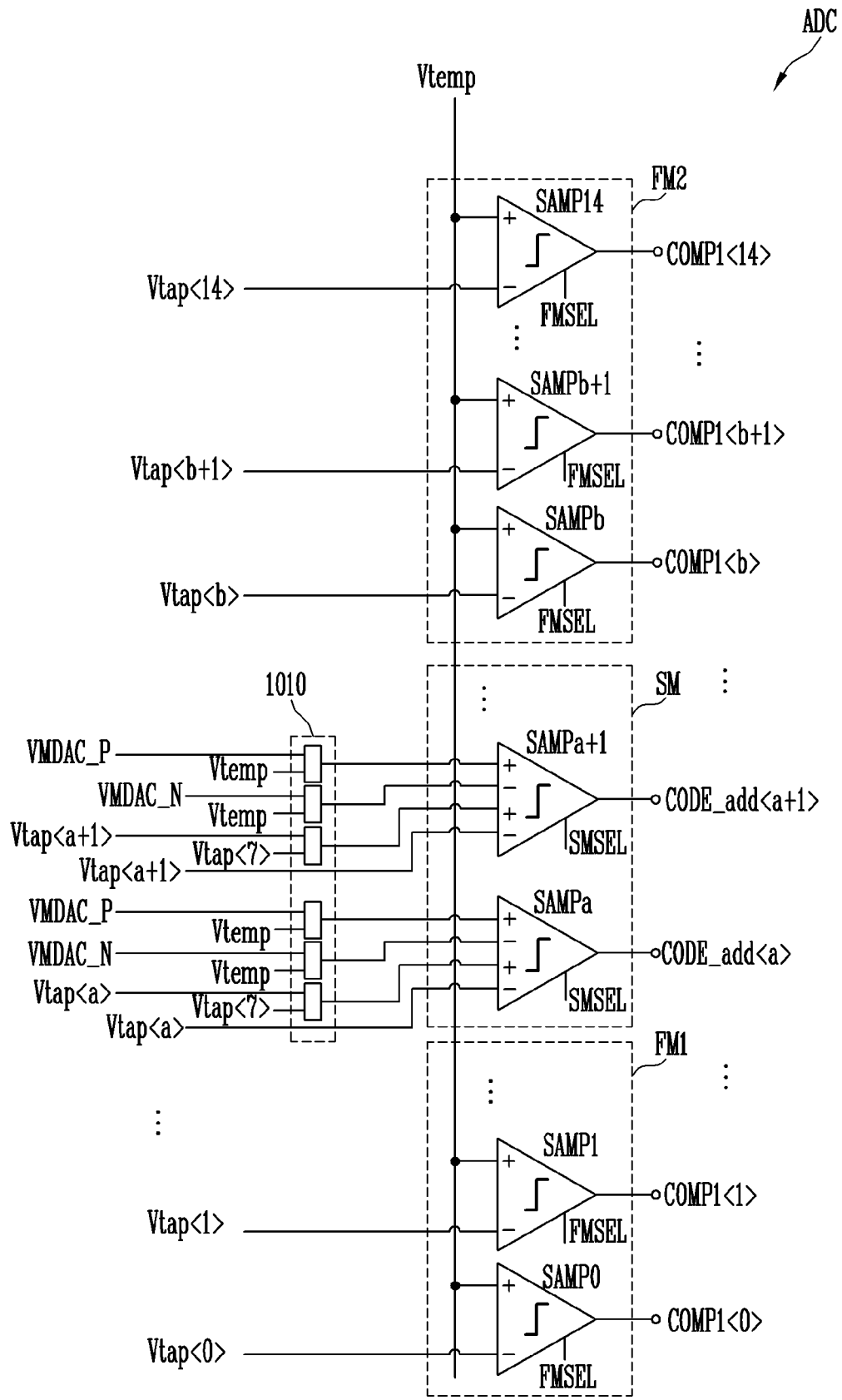
FIG. 10 is a circuit diagram illustrating an analog-to-digital converter of FIG. 8.

FIG. 10 is a circuit diagram illustrating an exemplary configuration of the analog-to-digital converter ADC of FIG. 8.

Referring to FIG. 10, the analog-to-digital converter ADC may output first codes COMP1<0>, <1>, . . . , <b>, <b+1>, . . . , <14> or additional codes CODE_add<a>, <a+1>, . . . in response to the mode select signal SMSEL or FMSEL, the second sub-divided voltages Vtap2#, the positive voltage VMDAC_P, and the negative voltage VMDAC_N. For example, the analog-to-digital converter ADC may include an additional code output circuit SM, first code output circuits FM1 and FM2, and multiplexers 1010. Individual circuits will be described in detail below.

The additional code output circuit SM and the first code output circuits FM1 and FM2 may include a plurality of select amplifiers SAMP0 to SAMP14. For example, the number of select amplifiers SAMP0 to SAMP14 may be identical to the number of first to 15-th divided voltages Vtap<14:0>. For example, the first to 15-th divided voltages Vtap<14:0> may be respectively applied to the select amplifiers SAMP0 to SAMP14.

The select amplifiers SAMP0, SAMP1, . . . , SAMPb, SAMPb+1, . . . , SAMP14 included in the first code output circuits FM1 and FM2 may be enabled in response to a fast mode select signal. Each of the select amplifiers SAMP0, SAMP1, . . . , SAMPb, SAMPb+1, . . . , SAMP14 included in the first code output circuits FM1 and FM2 may include one positive input terminal (+) and one negative input terminal (−), and may include one output terminal. For example, a temperature voltage Vtemp may be applied in common to the positive input terminals (+) of the select amplifiers SAMP0, SAMP1, . . . , SAMPb, SAMPb+1, . . . , SAMP14 included in the first code output circuits FM1 and FM2, and the divided voltages Vtap<0>, Vtap<1>, . . . , Vtap<b>, Vtap<b+1>, . . . , Vtap<14> respectively corresponding to the select amplifiers SAMP0, SAMP1, . . . , SAMPb, SAMPb+1, . . . , SAMP14 may be applied to the negative input terminals (−) of the select amplifiers. The select amplifiers SAMP0, SAMP1, . . . , SAMPb, SAMPb+1, . . . , SAMP14 may output first codes COMP1<0>, <1>, . . . , <b>, <b+1>, . . . , <14> in response to the temperature voltage Vtemp and the divided voltages Vtap<0>, Vtap<1>, . . . , Vtap<b>, Vtap<b+1>, . . . , Vtap<14>.

The select amplifiers SAMPa, SAMPa+1, . . . included in the additional code output circuit SM may be enabled in response to the slow mode select signal SMSEL. Each of the select amplifiers SAMPa, SAMPa+1, . . . included in the additional code output circuit SM may include two positive input terminals (+) and two negative input terminals (−), and may include one output terminal. For example, voltages outputted from the 1010 may be applied to the first positive input terminals (+), first negative input terminals (−), and second positive input terminals (+) of the select amplifiers SAMPa, SAMPa+1, . . . included in the additional code output circuit SM. The divided voltages Vtap<a>, Vtap<a+1>, . . . respectively corresponding to the select amplifiers SAMPa, SAMPa+1, . . . included in the additional code output circuit SM may be applied to the second negative input terminals (−) of the select amplifiers.

The a-th select amplifier SAMPa is described below by way of example.

The MUX 1010 coupled to the first positive input terminal (+) of the a-th select amplifier SAMPa may transfer a voltage selected from the positive voltage VMDAC_P and the temperature voltage Vtemp to the first positive input terminal (+). The MUX 1010 coupled to the first negative input terminal (−) may transfer a voltage selected from the negative voltage VMDAC_N and the temperature voltage Vtemp to the first negative input terminal (−). The MUX 1010 coupled to the second positive input terminal (+) may transfer a voltage selected from the a+1-th divided voltage Vtap<a> and the eighth divided voltage Vtap<7> to the second positive input terminal (+). For example, the eighth divided voltage Vtap<7> may be a voltage corresponding to a median value, among the divided voltages Vtap<b:0> outputted from the code voltage generator 200. The a+1-th divided voltage Vtap<a> applied to the MUX 1010 coupled to the second positive input terminal (+) is also applied to the second negative input terminal (−).

As in the case of the coupling configuration of the above-described a-th select amplifier SAMPa, remaining select amplifiers SAMPa+1, . . . included in the additional code output circuit SM may be configured in the same manner, and divided voltages corresponding to respective select amplifiers, instead of the a+1-th divided voltage Vtap<a>, may be applied to the remaining select amplifiers SAMPa+1, . . . , respectively. The select amplifiers SAMPa, SAMPa+1, . . . may output the additional codes CODE_add<a>, <a+1>, . . . , respectively, in response to the temperature voltage Vtemp, the positive voltage VMDAC_P, the negative voltage VMDAC_N, and the divided voltages Vtap<a>, Vtap<a+1>, . . . .

Although it is illustrated in FIG. 10 that the select amplifies SAMP0, SAMP1, . . . , and SAMPb, SAMPb+1, . . . , SAMP14 respectively included in the first code output circuits FM1 and FM2 are sequentially arranged, and that the select amplifiers SAMPa, SAMPa+1, . . . included in the additional code output circuit SM are sequentially arranged between the first code output circuits FM1 and FM2, the array order of the select amplifies SAMPa, SAMPa+1, . . . included in the additional code output circuit SM and the select amplifies SAMP0, SAMP1, . . . and SAMPb, SAMPb+1, . . . , SAMP14 included in the first code output circuits FM1 and FM2 may be changed.

Figure 11:
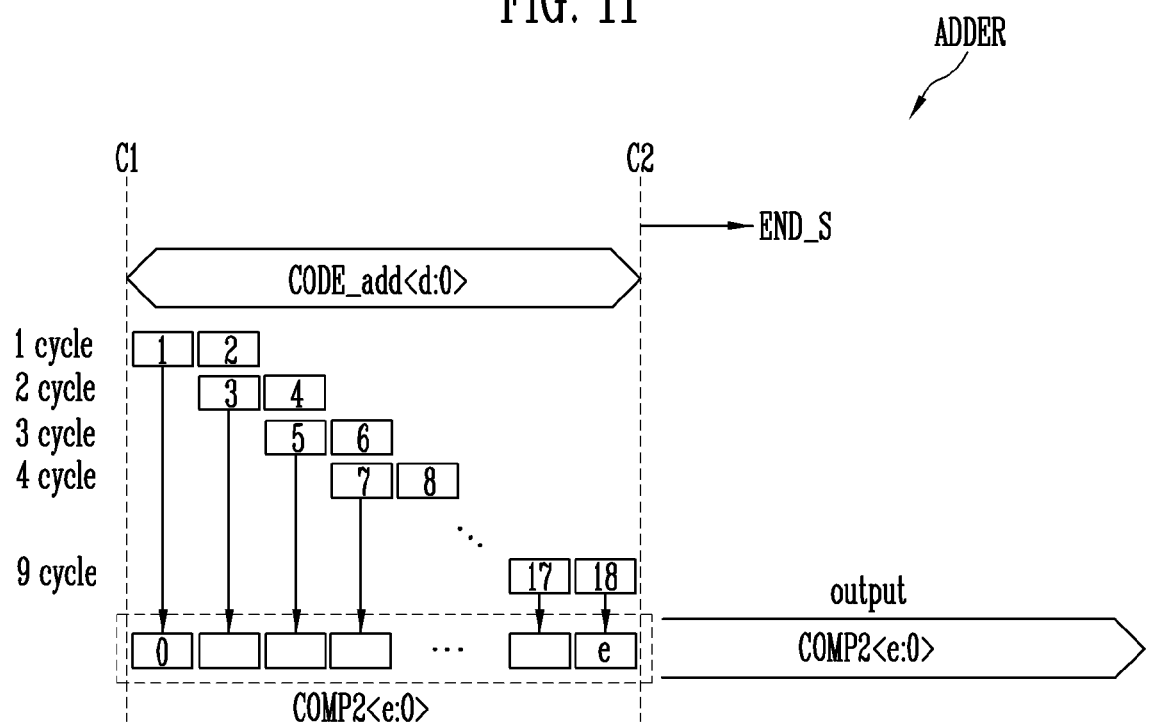
FIG. 11 is a simplified block diagram for explaining the operation of an adder of FIG. 8.

FIG. 11 is a simplified block diagram for explaining the operation of the adder ADDER of FIG. 8.

Referring to FIG. 11, the adder ADDER may be enabled in response to a slow mode select signal SMSEL. For example, the adder ADDER may output the second code COMP2<e:0> by adding additional codes CODE_add<d:0> received over multiple cycles. For example, a time C1 at which a first cycle starts and a time C2 at which a ninth cycle, i.e., a last cycle, ends may be set in advance, and additional codes CODE_add<d:0> may be received in respective cycles. When all of the additional codes CODE_add<d:0> are received in the last ninth cycle (denoted with "9 cycle" in FIG. 11), the adder ADDER may output an end signal END_S indicating that all of the set cycles have been executed. That is, a temperature value is measured in each cycle, and additional codes CODE_add<d:0> are generated based on respective measured temperature values, and thus a second code COMP2<e:0> having higher resolution than that of the first code COMP1<c:0> may be outputted in a slow mode. For example, the adder ADDER may receive 2-bit additional codes CODE_add<d:0> in each cycle, and some of the additional codes CODE_add<d:0> received in respective cycles may be added to generate the second code COMP2<e:0>. For example, it is assumed that additional codes CODE_add<d:0> received in the first cycle (denoted with "1 cycle" in FIG. 11) are '1' and '2', and that additional codes CODE_add<d:0> received in the second cycle (denoted with "2 cycle" in FIG. 11) are '3' and '4.' For example, data of '1' may be data of the second code COMP2<0>. Then, data of '2' and data of '3' may be added, and the added data may become data of the second code COMP2<1>. Therefore, assuming that pieces of data received in the last ninth cycle (denoted with "9 cycle" in FIG. 11) are '17' and '18', data of '18' may become data of the second code COMP2<e>. In this way, when the addition operation on additional codes CODE_add<d:0> received in respective cycles is terminated, the added data may be outputted as the second code COMP2<e:0>.

Accordingly, the first MUX 400 of FIG. 1 may receive either of the first code COMP1<c:0> and the second code COMP2<e:0> having different resolutions depending on the mode select signal SMSEL or FMSEL, and may output the received code as a temperature code T_CODE.

Figure 12:
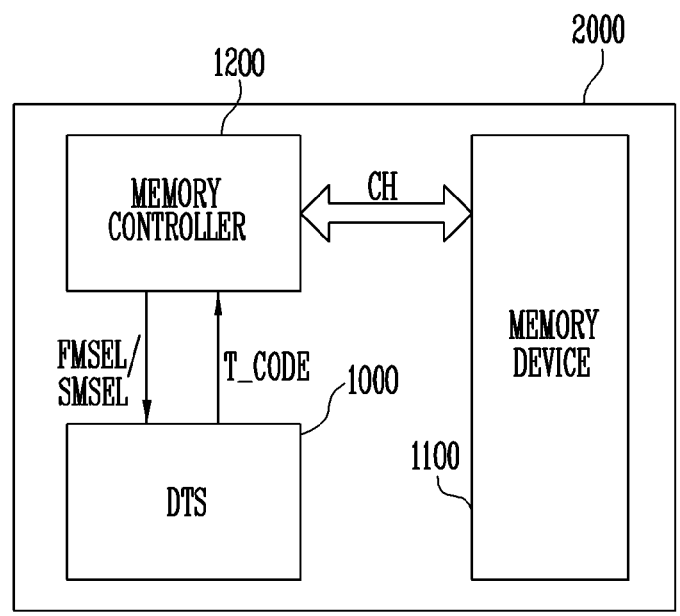
FIG. 12 is a simplified block diagram illustrating a memory system including a digital temperature sensing circuit in accordance with an embodiment of the present disclosure.

FIG. 12 is a simplified block diagram illustrating a memory system including the digital temperature sensing circuit according to an embodiment of the present disclosure.

Referring to FIG. 12, the above-described digital temperature sensing circuit 1000 may be included in a memory system 2000. For example, the memory system 2000 may include a memory device 1100 which stores data, a memory controller 1200 which controls the memory device 1100, and the digital temperature sensing circuit 1000 which measures the temperature of the memory system and outputs a temperature code T_CODE to the memory controller 1200.

When operating voltages are controlled by compensating for the internal temperature of the memory system 2000, the memory controller 1200 may output a fast mode select signal FMSEL to the digital temperature sensing circuit 1000.

For example, when the internal temperature is compensated for, it may be compensated for in real time only if a code capable of varying temperature in response to a temperature change is rapidly outputted, and thus the memory controller 1200 may transmit the fast mode select signal FMSEL to the digital temperature sensing circuit 1000. Since the digital temperature sensing circuit 1000 may rapidly output the temperature code T_CODE in response to the fast mode select signal FMSEL, the memory controller 1200 may rapidly respond to the temperature change. For example, the internal temperature may be the temperature of the memory system 2000, the temperature of the memory controller 1200, or the temperature of the memory device 1100.

When a temperature value is provided to the memory system 2000, accurate temperature information must be provided, and thus the memory controller 1200 may transmit a slow mode select signal SMSEL to the digital temperature sensing circuit 1000. The digital temperature sensing circuit 1000 may output a temperature code T_CODE, which has an operating time longer than that of the fast mode, but has a resolution higher than that of the fast mode, in response to the slow mode select signal, thus improving the reliability of temperature values.

Although, in the above-described embodiment, the fast mode and the slow mode have been described, a low-resolution mode and a high-resolution mode in addition to the fast and slow modes may be included as various modes, or alternatively, three or more modes may be included as various modes.

Figure 13:
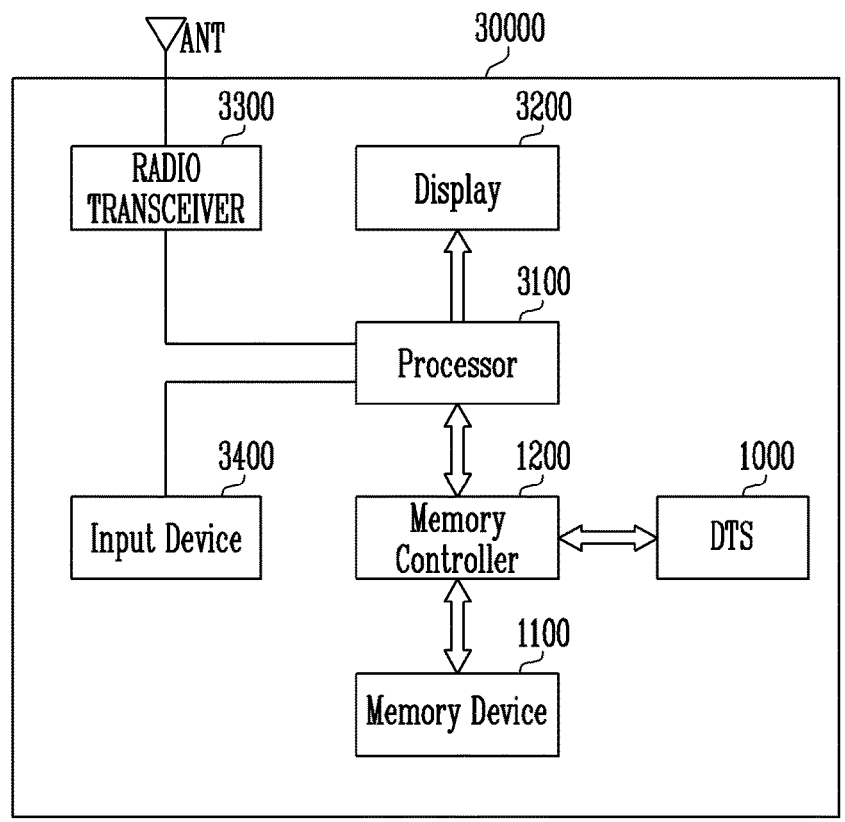
FIG. 13 is a simplified block diagram illustrating an embodiment of a memory system including the digital temperature sensing circuit of FIG. 1.

FIG. 13 is a simplified block diagram illustrating an embodiment of a memory system 30000 including the digital temperature sensing circuit of FIG. 1.

Referring to FIG. 13, the memory system 30000 may be implemented as a cellular phone, a smart phone, a tablet PC, a personal digital assistant (PDA) or a wireless communication device. The memory system 30000 may include a memory device 1100, a digital temperature sensing circuit (DTS) 1000 which may output a temperature value as a temperature code that is a digital code, and a memory controller 1200 which may control the digital temperature sensing circuit 1000 and the memory device 1100. The memory controller 1200 may control a data access operation for the memory device 1100, for example, a program operation, an erase operation or a read operation, under the control of a processor 3100. Further, the memory controller 1200 may receive temperature codes having different resolutions by controlling the digital temperature sensing circuit 1000 in various modes. Data programmed to the memory device 1100 may be outputted via a display 3200 under the control of the memory controller 1200 and/or the processor 3100.

A radio transceiver 3300 may exchange radio signals through an antenna ANT. For example, the radio transceiver 3300 may change a radio signal received through the antenna ANT into a signal which may be processed in the processor 3100. Therefore, the processor 3100 may process a signal outputted from the radio transceiver 3300 and transmit the processed signal to the memory controller 1200 or the display 3200.

The memory controller 1200 may transmit the signal processed by the processor 3100 to the memory device 1100. Furthermore, the radio transceiver 3300 may change a signal outputted from the processor 3100 into a radio signal, and output the changed radio signal to an external device through the antenna ANT. An input device 3400 may be used to input a control signal for controlling the operation of the processor 3100 or data to be processed by the processor 3100. The input device 3400 may be implemented as a pointing device such as a touch pad or a computer mouse, a keypad, a keyboard, or any combination thereof. The processor 3100 may control the operation of the display 3200 such that data outputted from the memory controller 1200, data outputted from the radio transceiver 3300, or data outputted from the input device 3400 is outputted via the display 3200.

In various embodiments, the memory controller 1200 capable of controlling the operation of the memory device 1100 may be implemented as a part of the processor 3100 or a chip provided separately from the processor 3100.

Figure 14:
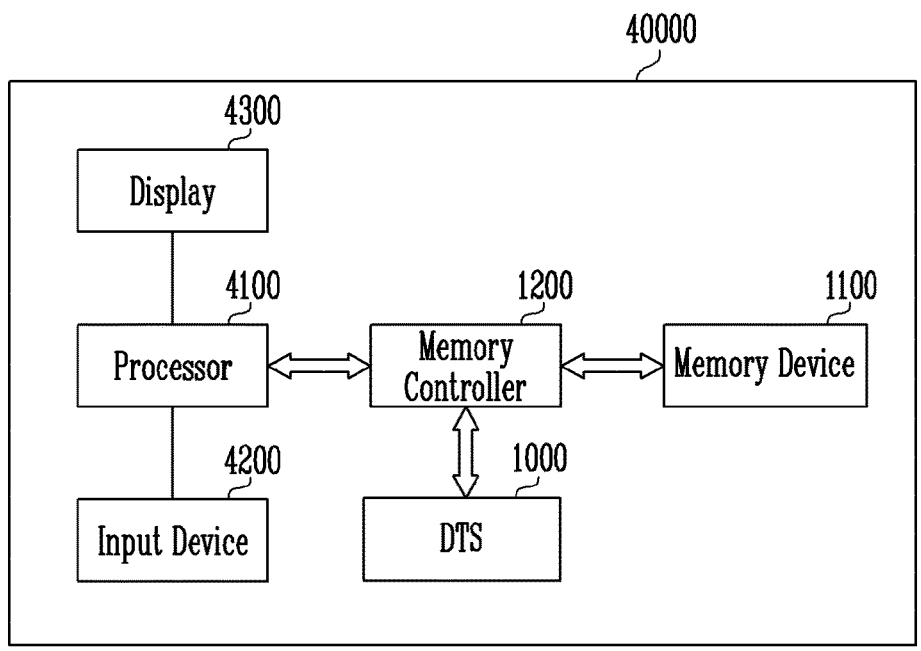
FIG. 14 is a simplified block diagram illustrating an embodiment of a memory system including the digital temperature sensing circuit of FIG. 1.

FIG. 14 is a simplified block diagram illustrating another embodiment of a memory system 40000 including the digital temperature sensing circuit 1000 of FIG. 1.

Referring to FIG. 14, the memory system 40000 may be embodied in a personal computer, a tablet PC, a net-book, an e-reader, a personal digital assistant (PDA), a portable multimedia player (PMP), an MP3 player, or an MP4 player.

The memory system 40000 may include a memory device 1100, the digital temperature sensing circuit (DTS) 1000 which may output a temperature value as a temperature code that is a digital code, and a memory controller 1200 which may control the digital temperature sensing circuit 1000 and the memory device 1100. Further, the memory controller 1200 may receive temperature codes having different resolutions by controlling the digital temperature sensing circuit 1000 in various modes.

A processor 4100 may output data stored in the memory device 1100 via a display 4300 according to data inputted from an input device 4200. For example, the input device 4200 may be implemented as a pointing device such as a touch pad or a computer mouse, a keypad, a keyboard, or a combination thereof.

The processor 4100 may control the overall operation of the memory system 40000 and control the operation of the memory controller 1200. In an embodiment, the memory controller 1200 capable of controlling the operation of the memory device 1100 may be implemented as a part of the processor 4100 or a chip provided separately from the processor 4100.

Figure 15:
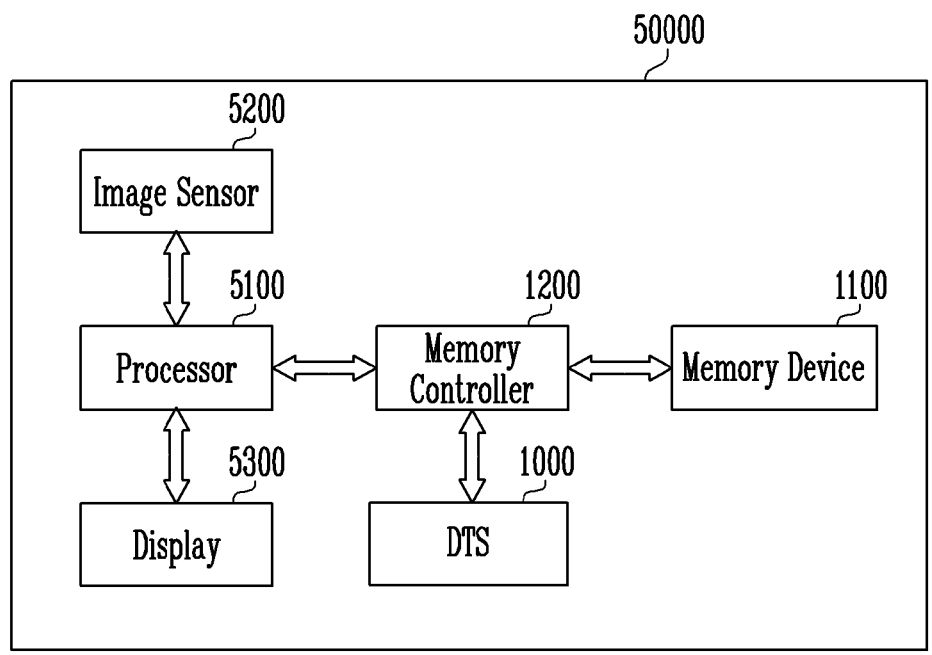
FIG. 15 is a simplified block diagram illustrating an embodiment of a memory system including the digital temperature sensing circuit of FIG. 1.

FIG. 15 is a simplified block diagram illustrating yet another embodiment of a memory system 50000 including the digital temperature sensing circuit 1000 of FIG. 1.

Referring to FIG. 15, the memory system 50000 may be embodied in an image processing device, e.g., a digital camera, a mobile phone provided with a digital camera, a smartphone provided with a digital camera, or a tablet PC provided with a digital camera.

The memory system 50000 may include a memory device 1100, the digital temperature sensing circuit (DTS) 1000 which may output a temperature value as a temperature code that is a digital code, and a memory controller 1200 which may control the digital temperature sensing circuit 1000 and the memory device 1100. Further, the memory controller 1200 may receive temperature codes having different resolutions by controlling the digital temperature sensing circuit 1000 in various modes.

An image sensor 5200 of the memory system 50000 may convert an optical image into digital signals. The converted digital signals may be transmitted to a processor 5100 or the memory controller 1200. Under the control of the processor 5100, the converted digital signals may be outputted via a display 5300 or stored in the memory device 1100 through the memory controller 1200. Data stored in the memory device 1100 may be outputted via the display 5300 under the control of the processor 5100 or the memory controller 1200.

In various embodiments, the memory controller 1200 capable of controlling the operation of the memory device 1100 may be implemented as a part of the processor 5100, or a chip provided separately from the processor 5100.

Figure 16:
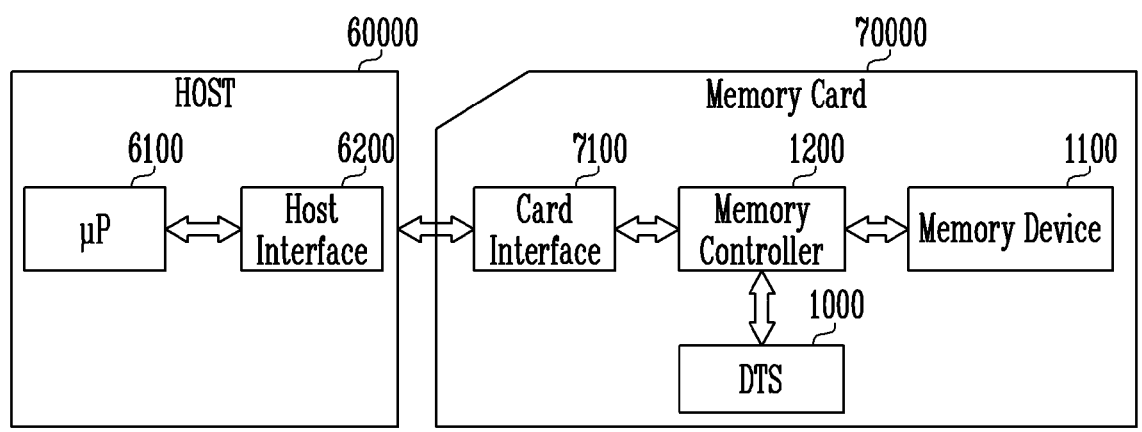
FIG. 16 is a simplified block diagram illustrating an embodiment of a memory system including the digital temperature sensing circuit of FIG. 1.

FIG. 16 is a simplified block diagram illustrating yet another embodiment of a memory system 70000 including the digital temperature sensing circuit 1000 of FIG. 1.

Referring to FIG. 16, the memory system 70000 may be implemented as a memory card or a smart card. The memory system 70000 may include a memory device 1100, the digital temperature sensing circuit (DTS) 1000, a memory controller 1200, and a card interface 7100.

The memory controller 1200 may control data exchange between the memory device 1100 and the card interface 7100. In an embodiment, the card interface 7100 may be, but is not limited to, a secure digital (SD) card interface or a multi-media card (MMC) interface.

The card interface 7100 may interface data exchange between a host 60000 and the memory controller 1200 according to a protocol of the host 60000. In an embodiment, the card interface 7100 may support a universal serial bus (USB) protocol and an inter-chip (IC)-USB protocol. For example, the card interface may refer to hardware capable of supporting a protocol which is used by the host 60000, software installed in the hardware, or a signal transmission method.

When the memory system 70000 is coupled to a host interface 6200 of the host 60000, such as a PC, a tablet PC, a digital camera, a digital audio player, a mobile phone, console video game hardware or a digital set-top box, the host interface 6200 may perform data communication with the memory device 1100 through the card interface 7100 and the memory controller 1200 under the control of a microprocessor (μP) 6100.

The digital temperature sensing circuit according to the present disclosure may output temperature codes by selectively varying resolution depending on various modes using a single temperature sensing circuit, thus reducing an area occupied by the digital temperature sensing circuit.

While the exemplary embodiments of the present disclosure have been disclosed for illustrative purposes, those skilled in the art will appreciate that various modifications, additions and substitutions are possible. Therefore, the scope of the present disclosure must be defined by the appended claims and equivalents of the claims rather than by the description preceding them.

What is claimed is:

1. A memory system, comprising:
   a memory device configured to perform operations using operation voltages;
   a digital temperature sensing circuit configured to sense a temperature of the memory system and output a digital temperature code corresponding to the temperature in response to a mode select signal; and
   a memory controller configured to output the mode select signal indicating a number of bits of the digital temperature code, to receive the digital temperature code from the digital temperature sensing circuit and to control the memory device to change levels of the operation voltages based on the digital temperature code,
   wherein the digital temperature code includes a first code or a second code having different numbers of bits according to the mode select signal.

2. The memory system of claim 1,
   wherein the mode select signal is a high-resolution mode signal or a low-resolution mode signal.

3. The memory system of claim 2,
wherein the digital temperature sensing circuit includes:
a temperature voltage generator configured to receive a first reference voltage, a second reference voltage and a trimming code, to generate a temperature voltage varying with a temperature by comparing a divided voltage outputted from a division circuit with a sub-voltage which is outputted from a temperature compensation circuit and inversely proportional to the temperature, and to generate a high voltage and a low voltage by dividing a supply voltage in response to the second reference voltage; and
a code voltage generator configured to output code voltages having different voltage levels between the high voltage and the low voltage by dividing the second reference voltage.

4. The memory system of claim 3,
wherein the digital temperature sensing circuit further includes:
a mode selector configured to receive the temperature voltage and the code voltages, and to generate the first code or the second code, by using the temperature voltage and the code voltages, in response to the mode select signal.

5. The memory system of claim 3,
wherein the temperature voltage generator is configured to output the temperature voltage, the high voltage, and the low voltage in response to the first reference voltage and the trimming code.

6. The memory system of claim 4,
wherein the code voltage generator comprises:
a high-voltage transfer circuit configured to apply the second reference voltage to an output terminal of the high-voltage transfer circuit in response to the high voltage;
a low-voltage transfer circuit configured to form a current path on an output terminal in response to the low voltage; and
a divided voltage resistor string coupled between the output terminal of the high-voltage transfer circuit and the output terminal of the low-voltage transfer circuit and configured to output the code voltages.

7. The memory system of claim 4,
wherein the mode selector comprises:
a multi-digital-to-analog converter supplied with the temperature voltage and first sub-divided voltages included in the code voltages, and configured to output a positive voltage and a negative voltage in response to the mode select signal;
a second analog-to-digital converter supplied with second sub-divided voltages, the temperature voltage, the positive voltage, and the negative voltage, and configured to output the first code for a first mode or an additional code for a second mode in response to the mode select signal, wherein the second sub-divided voltages include voltages other than the first sub-divided voltages, among the code voltages; and
an adder configured to receive additional codes in set cycles in response to the mode select signal, add the received additional codes, and output a resulting code as the second code for the second mode.

8. The memory system of claim 7,
wherein a number of bits of the second code is greater than a number of bits of the first code.

9. A memory system, comprising:
a memory device configured to perform operations using operation voltages;
a digital temperature sensing circuit configured to sense a temperature of the memory system and output a digital temperature code corresponding to the temperature in response to a mode select signal; and
a memory controller configured to output the mode select signal indicating a number of bits of the digital temperature code, to receive the digital temperature code from the digital temperature sensing circuit and to control the memory device to change levels of the operation voltages based on the digital temperature code,
wherein the digital temperature sensing circuit includes:
a temperature voltage generator configured to generate a temperature voltage varying with a temperature, a high voltage, and a low voltage;
a code voltage generator configured to output divided voltages having various voltage levels based on the high voltage and the low voltage; and
a mode selector supplied with the temperature voltage and the divided voltages, and configured to output first codes or second codes having a resolution higher than that of the first codes in response to a mode select signal.

10. The memory system of claim 9, wherein the mode selector is configured to:
output the first codes in response to a low-resolution mode signal, and
output the second codes in response to a high-resolution mode signal.

11. The memory system of claim 10, wherein the second codes are outputted by adding codes generated depending on the temperature for a time longer than that of the first codes.

* * * * *